United States Patent [19]

Jackson

[11] Patent Number: 4,644,634
[45] Date of Patent: Feb. 24, 1987

[54] REMOVABLE BLADES FOR CUT-CLINCH HEAD ASSEMBLY

[75] Inventor: Rodney P. Jackson, Auburn, N.H.

[73] Assignee: USM Corporation, Farmington, Conn.

[21] Appl. No.: 635,628

[22] Filed: Jul. 30, 1984

[51] Int. Cl.⁴ .............................................. B21F 1/00
[52] U.S. Cl. ................................. 29/566.3; 29/564.8; 29/741; 140/105; 227/79
[58] Field of Search ................ 29/564.8, 566.3, 715, 29/741, 749, 761; 227/79; 140/930, 105; 407/103; 83/196, 198, 200

[56] References Cited

U.S. PATENT DOCUMENTS

| | | | |
|---|---|---|---|
| 2,893,010 | 7/1959 | Stuhre | 29/564.8 |
| 3,646,659 | 3/1972 | Ragard | 29/761 X |
| 3,986,533 | 10/1976 | Woodman, Jr. | 140/105 |
| 4,125,136 | 11/1978 | Olcese et al. | 83/198 X |
| 4,135,558 | 1/1979 | Ragard et al. | 140/105 |
| 4,151,637 | 5/1979 | Zemek et al. | 140/105 X |
| 4,165,557 | 8/1979 | Taguchi et al. | 29/566.3 |
| 4,209,047 | 6/1980 | Weill | 407/103 X |
| 4,292,727 | 10/1981 | Maxner | 29/564.8 X |
| 4,434,550 | 3/1984 | Wilke | 29/741 X |
| 4,516,310 | 5/1985 | Bandura | 227/79 X |
| 4,520,549 | 6/1985 | Whitlex et al. | 83/200 X |

Primary Examiner—Gil Weidenfeld
Assistant Examiner—Glenn L. Webb
Attorney, Agent, or Firm—Alan N. McCartney

[57] ABSTRACT

A cut-clinch head having a movable and a fixed knife assembly for cutting and forming lead wires of electrical components which extend down through openings in printed circuit boards. The movable knife and the fixed knife are easily removed from the head assembly for servicing. Further, the fixed knife is a tubular member that has a cutting edge formed out of the axis of the tube.

3 Claims, 5 Drawing Figures

REMOVABLE BLADES FOR CUT-CLINCH HEAD ASSEMBLY

BACKGROUND OF THE INVENTION (1) Field of the Invention

An improved mounting for the blades of a cut-clinch head assembly of an electrical component assembly machine.

(2) Summary of the Prior Art

In assembling axial lead electrical components to printed circuit boards, the component lead wires are inserted down through predetermined openings in the printed circuit boards. Thereafter, a cut-clinch mechanism, located beneath the board, cuts and bends over or clinches the lead wire to the underside of the board to securely attach the component to the board. This permits the board to be handled during the remaining assembly operations prior to permanently attaching the components to the board by wave soldering, for example.

The lead wire is inserted into a fixed knife in the head assembly and a movable knife passes over the fixed knife to cut and clinch the lead wire. Over a period of time, the cutting edges of the knives become worn and it is desirable to provide a means for easily removing the knives for servicing.

The U.S. Pat. No. 4,292,727 to Maxner, illustrates a cut-clinch mechanism in which the cut-clinch head assembly has a fixed knife and a movable knife that moves into cutting relationship with the fixed knife to cut and bend over the lead wire to attach an electrical component to a printed circuit board. Other prior art cut-clinch mechanism are illustrated in U.S. Pat. Nos. 4,153,082 and 4,403,406.

BRIEF SUMMARY OF THE INVENTION

According to the present invention, a cut-clinch head assembly has a fixed knife and a movable knife with means to drive the movable knife into contact with the fixed knife to sever and bend over the lead wire of an electrical component to secure the component to a printed circuit board. Both the fixed knife and the movable knife are mounted for removal for servicing in a manner that does not require removal of any other parts of the head assembly. The movable knife is mounted to a drive for the knife by a threaded pin which can be threaded through the knife so that the knife can be easily removed from the drive mounting. The fixed knife is clamped in an opening in the head assembly, the clamping means being releasable for easy removal of the knife from the head assembly. Additionally, the lead wire is positioned down through the fixed knife against a cutting edge of the knife that is formed away from the surface of the knife to provide a more efficient, longer lasting cutting edge on the fixed knife.

DESCRIPTION OF THE PREFERRED EMBODIMENT

The cut-clinch head assembly of this invention is adapted to be positioned below a printed circuit board in an automatic axial lead component assembly machine. The general environment for the application of this cut-clinch head assembly is illustrated in U.S. Pat. No. 4,080,730. As shown in that patent there are two opposed, right-hand and left-hand, cut-clinch head assemblies, each of which cut and clinch a component lead wire extending down through the board from opposite ends of the axial lead component. In this application, only one head assembly 10 (left-hand) is described in detail since both right and left head assemblies are identical. The head assembly 10 is adapted to be mounted on a support (not shown) to be positioned beneath a printed circuit board.

The novel mounting for the blades of the cut-clinch head which comprises this invention is disclosed in head assembly that contains a novel sensing mechanism that signals the machine control that the lead wire is in proper position in the head assembly. This later feature is the subject of applicant's co-pending application Ser. No. 635,629, filed July 30, 1984, U.S. Pat. No. 4,574,462.

Figure 1:
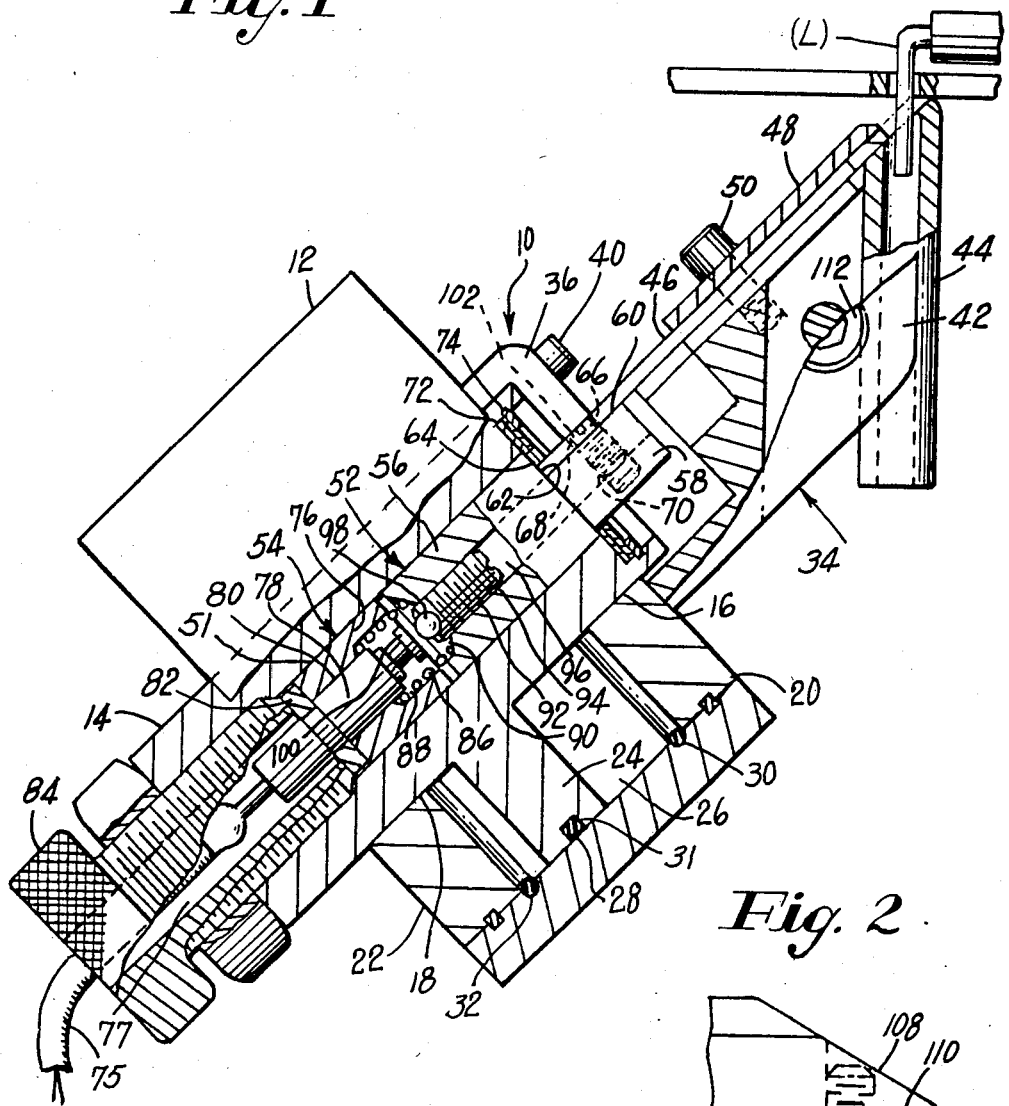
FIG. 1 is a side view, partially in section, of one of the cut-clinch head assemblies.

Attention is now directed to FIG. 1 wherein the head assembly 10 comprises a pneumatically operated cylinder 12 carrying a piston 14. The piston 14 is positioned through annular openings 16, 18 in the end plates 20, 22 of the cylinder 12. The piston 14 has an annular flange 24 received in the operating chamber 26 of the cylinder 12. An annular seal 28 rides in the groove 31 in flange 24 to seal the flange in the chamber 26. Seals 30, 32 are positioned between the end plates 20, 22 of the cylinder 12 to seal the operating chamber 26. Thus, it can be seen that air introduced into the operating chamber 26 on either side of flange 24 will move the piston 14 back and forth in the cylinder 12.

Mounted on the forward end plate 20 of cylinder 12 is a nose block 34. The block 34, has legs 36, 38 secured to the end plate 20 by screws 40. A forward extension 42 of block 34 carries a fixed knife 44 and a movable knife 46. A knife retainer 48 is fastened over the movable knife 46 by screws 50.

The piston 14 has a cylindrical axial opening 51 housing the movable knife carrier 52 and the sensing mechanism 54. The knife carrier 52 is a cylindrical plug 56 slidably disposed in opening 51. The plug 56 has a reduced extension 58 with a flat upper surface 60 upon which the knife 46 is positioned. The rear shoulder 62 of the knife 46 is positioned against the shoulder 64 of the extension 58. A set screw or pin 66 passes through the opening 68 in knife 46 and is threaded into the opening 70 in extension 58.

The shoulder 64 of the plug 56 rests against washers 72 retained in the end of piston 14 by retaining ring 74.

The sensor 54 comprises a guide bushing 76 disposed in the axial opening 51. An insulated electrical contact 78 is disposed in opening 80 in the guide bushing 76. A washer 82 surrounds contact 78 and is positioned in the axial opening 51 by the screw 84. The washer 82 also contacts the rear of guide bushing 76 to retain the bushing 76 in opening 51. The wire 75 from contact 78 passes through the opening 77 in screw 84.

A compression spring 86 is received between the recess 88 in the bushing 76 and the recess 90 in the plug 56. A ball plunger 92 has a body portion 94 threaded into the opening 96 in the carrier 52. The body portion 94 of ball plunger 92 carries a ball contact 98.

In the operation of the cut-clinch head assembly thus far described, air introduced into the operating chamber 26 on the back side of flange 24 will cause the piston 14 to move upwardly. This moves knife 46 toward the fixed knife 44. If a component lead wire (L) is positioned down into a chamber at the upper end of the fixed knife 44 as illustrated in FIG. 1, as the movable knife contacts the lead, the resistance to further movement will cause the spring 86 to be compressed as the piston 14 moves upwardly. This causes the ball contact 98 on plunger 92 to engage the forward end 100 of insulated electrical contact 78. This senses that the component lead is in proper position and signals the machine control that the mechanism can continue to operate. Further movement of knife 46 will cut and clinch the lead wire.

If on the other hand, the component lead is not received in the fixed knife (due to for example, the lead being bent or not actually being positioned through the opening in the board), there would be no resistance to the movement of the knife 46. Thus, there would be no force against the compression spring 86 and the contacts 98, 100 would not engage. This condition would signal the machine control to prevent further operation until the fault was corrected.

Since the ball plunger 92 is threaded into the opening 96 of plug 56, the contacts 98, 100 can be slightly moved toward or away from one another to fine tune the sensing mechanism. Access to the ball plunger 92 for adjustment purposes is accomplished by removing screws 40 and blocks 34. This exposes the end of opening 96. After removal of the set screw 66 from opening 70, a tool can be inserted in opening 96 to adjust ball plunger 92. For example, turning ball plunger 92 into the opening 96 will move contacts 98, 100 closer together. Likewise, the contacts 98, 100 can be moved apart by turning ball plunger outwardly. In the machine set up, the fine tuning is accomplished by moving carrier 56 toward guide bushing 76 until the members contact one another. Thereafter, the ball plunger 92 is threaded inwardly until the contact 98 just meets contact 100 and the machine control indicates that such contact has been made. This provides a finite touch contact engagement of the contacts 98,100 to assure a minimum of contact force at the time the sensor is energized to prolong the life of the sensor while maintaining the reliability of the function of the sensor.

In a cut-clinch mechanism for cutting and forming component leads, after an extended period of use the cutting edge of both the fixed and movable knife will wear. Thus, it is desirable to be able to quickly and efficiently remove the knives for either sharpening or replacement. It is particularly desirable to be able to remove the knives without removing any other operating portions of the mechanism or even removing any fastening means that could be lost or misplaced while this maintenance procedure is taking place.

Figure 2:
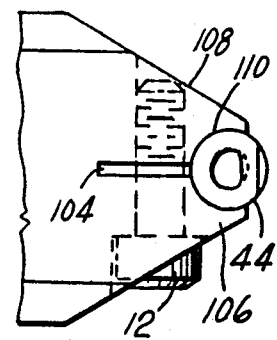
FIG. 2 is a top plan view of the mounting for the fixed knife.
Figure 3:
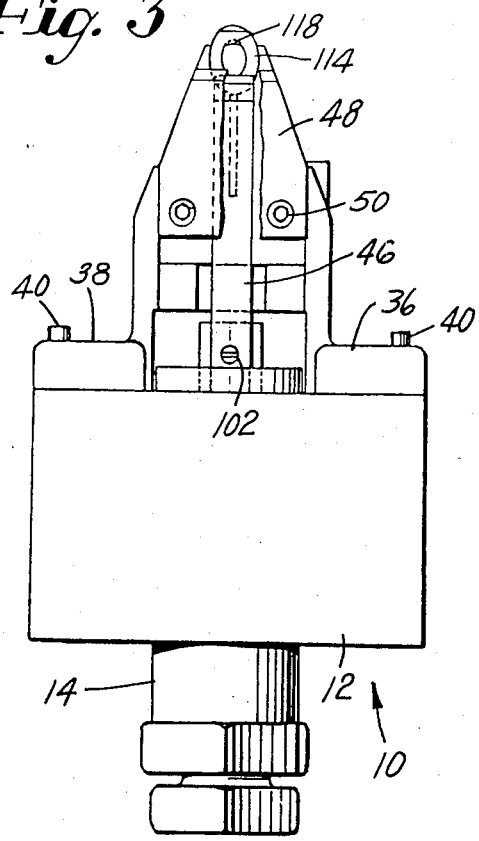
FIG. 3 is a top plan view illustrating the movable knife in retacted position.
Figure 4:
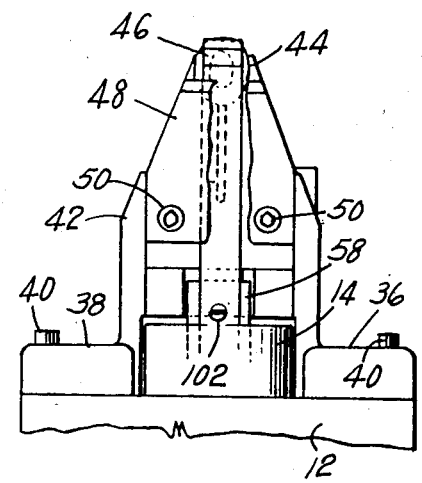
FIG. 4 is a top plan view illustrating the movable knife in the extended position during the cut-clinch operation.
Figure 5:
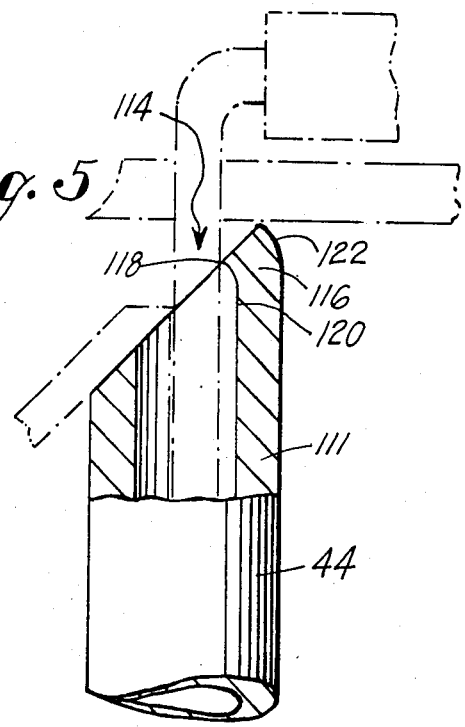
FIG. 5 is an enlarged view of the end of the fixed knife.

Attention is directed to FIGS. 1, 2 and 5 which illustrate the novel manner in which the knives 44 and 46 are mounted and can be easily removed from the head assembly for servicing. As previously mentioned, the movable knife 46 is retained on the extension 58 of carrier 52 by a set screw or pin 66. The threaded opening 70 in extension 58 is greater in depth than the length of set screw 66. To remove the knife 46, the operator merely turns the set screw 66 into the opening 70 until the screw head 102 extends below the surface of the opening 68 in knife 46. Thereafter, the knife 46 can be slid out of the head past the end of the fixed knife 44. To replace the knife 46, the knife can be slid back into the head assembly and the set screw 66 turned outwardly back into the opening 68 in the knife to lock the knife to the carrier 52. In this fashion, the knife 46 can be easily removed from the head assembly for servicing without the removal of any other parts of the head assembly.

Attention is now directed to FIGS. 1 and 2 which illustrate the novel manner of removing the fixed knife 44 from the head assembly for servicing or replacement. The nose block 34 is bifurcated at 104 into two segments 106, 108. At the end of the nose block 34 is a cylindrical opening 110 which receives the cylindrical body of the fixed knife 44. A threaded fastener 112 is secured through segment 106 and is threaded into segment 108. After the fixed knife is inserted into the opening 110, the fastener 112 can be tightened to close the segments 106,108 and clamp the knife 44 in the opening 110. To service the knife 44, loosening the fastener 112 will permit removal of the knife 44 from the head assembly. Again, as with the movable knife 46, the fixed knife 44 can be removed without removing any other parts of the head assembly.

Attention is now directed to FIGS. 1, 2 and 5 which illustrate the novel cutting edge portion of the fixed knife that assures a good cutting action on the lead wire and provides a longer cutting edge life for the fixed knife.

The fixed knife 44 is comprised of a tubular member 111 adapted to receive the component lead (L), as illustrated in FIG. 1. The end portion 114 of the tube is cut at an angle to the axis of the tube. This permits the angularly disposed movable knife 46 to act at an angle to the lead wire to facilitate the cutting operation. The end portion 114 of the tube 111 has an outboard edge 116 against which the cutting action occurs. A cutting lip 118 is formed out of the surface 120 of the inside of the tube. This cutting lip 118 is formed by deforming the end 122 of the tube, as shown in FIG. 5. Thus, there has been provided a cutting lip 118 on the end of the fixed knife that will act against the lead wire in substantially the same angular direction as the movable knife during the lead cutting operation. This increases the efficiency of the cutting operation and substantially increases the operating life of the fixed knife.

It should also be noted that the tubular member 111 conveys the cut lead wire away from the operating parts of the head assembly. This assures that the removed wire will not effect the continued operation of the head assembly.

I claim:

1. A head assembly for cutting and clinching the lead wires of an electrical component which extend down through openings in printed circuit boards comprising:

a. a fixed knife adapted to be positioned below a printed circuit board to receive the lead wire extending through an opening in the board; said fixed knife including a tubular member mounted on a vertical axis and adapted to receive the lead wire and having an opening disposed at an angle to said vertical axis, said fixed knife having a cutting edge formed out of said opening and being formed out of the surface of the tubular member at said angle of said opening;

b. mounting means for removably retaining said fixed knife on said head assembly on an axis normal to the board, said mounting means comprising clamping means on said head assembly between which said fixed knife is secured;

c. a flat movable knife slidably mounted on said head assembly at an angle to said fixed knife axis and at substantially the same angle as said fixed knife cutting edge and having a cutting edge movable into cutting relation with said fixed cutting edge so that said movable knife cutting edge and said fixed knife cutting edge act on the lead wire at the same angular direction;

d. drive means having an upper surface exposed toward the board for moving said movable knife;

e. means for removably mounting said movable knife on said upper drive means surface including a pin threaded into said drive means and having a head in an opening in said knife exposed toward the board; and f. said movable knife being removable from said head assembly by turning said pin into the threaded opening and said drive means until said pin head passes beneath the undersurface of said movable knife permitting said movable knife to be removed from said drive means.

2. The head assembly of claim 1 wherein said clamping means is spaced sections on said head assembly between which said fixed knife is clamped by a fastener means.

3. The head assembly of claim 1 wherein said cutting edge is formed by deforming the end of said tubular member.

* * * * *